(12) United States Patent
Nien et al.

(10) Patent No.: US 10,541,139 B2
(45) Date of Patent: Jan. 21, 2020

(54) PLANARIZATION CONTROL IN SEMICONDUCTOR MANUFACTURING PROCESS

(71) Applicant: TAIWAN SEMICONDUCTOR MANUFACTURING CO., LTD., Hsinchu (TW)

(72) Inventors: Po-Chin Nien, Hsinchu (TW); William Weilun Hong, Hsinchu (TW); Ying-Tsung Chen, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 15/079,243

(22) Filed: Mar. 24, 2016

(65) Prior Publication Data

US 2017/0278712 A1    Sep. 28, 2017

(51) Int. Cl.
*H01L 21/28* (2006.01)
*H01L 29/66* (2006.01)
*H01L 21/321* (2006.01)
*H01L 21/3105* (2006.01)

(52) U.S. Cl.
CPC .............................. *H01L 21/28123* (2013.01)

(58) Field of Classification Search
CPC ......... H01L 21/28123; H01L 29/66795; H01L 29/66545; H01L 21/044; H01L 21/049; H01L 21/28008; H01L 21/823437; H01L 21/823828; H01L 29/4232; H01L 29/78391; H01L 29/7845; H01L 29/7856; H01L 21/823821
See application file for complete search history.

(56) References Cited

U.S. PATENT DOCUMENTS

| | | | | |
|---|---|---|---|---|
| 6,551,913 B1* | 4/2003 | Kim | ..................... | H01L 29/665 257/E21.438 |
| 2004/0253775 A1* | 12/2004 | Achuthan | ................ | C09G 1/02 438/197 |
| 2007/0015366 A1* | 1/2007 | Enda | .................... | H01L 21/3081 438/692 |
| 2014/0162446 A1* | 6/2014 | Lin | ................. | H01L 21/823437 438/585 |
| 2015/0056795 A1* | 2/2015 | Kang | .................... | H01L 29/785 438/585 |
| 2015/0380269 A1* | 12/2015 | Koli | .................... | H01L 21/3212 257/618 |

* cited by examiner

*Primary Examiner* — Moazzam Hossain
*Assistant Examiner* — Stanetta D Isaac
(74) *Attorney, Agent, or Firm* — Sterne, Kessler, Goldstein & Fox P.L.L.C.

(57) ABSTRACT

A method of forming a semiconductor device includes forming fins on a substrate, depositing a gate layer having a first material on the fins, and depositing a sacrificial layer having a second material on the gate layer. The method further includes removing a first portion of the sacrificial layer using a first slurry or etchant having a first selectivity of second material to first material. The method further includes removing a first portion of the gate layer and a second portion of the sacrificial layer using a second slurry or etchant having a second selectivity of second material to first material to form a planarized gate layer. The first selectivity is greater than the second selectivity. An example benefit includes reduced dependency of the gate layer planarization process on underlying structure density and reduced variation in thickness of the gate layer on device structures across a wafer.

20 Claims, 7 Drawing Sheets

PLANARIZATION CONTROL IN SEMICONDUCTOR MANUFACTURING PROCESS

BACKGROUND

This disclosure generally relates to semiconductor devices and methods of fabricating the same.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and finFETs.

Such scaling has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
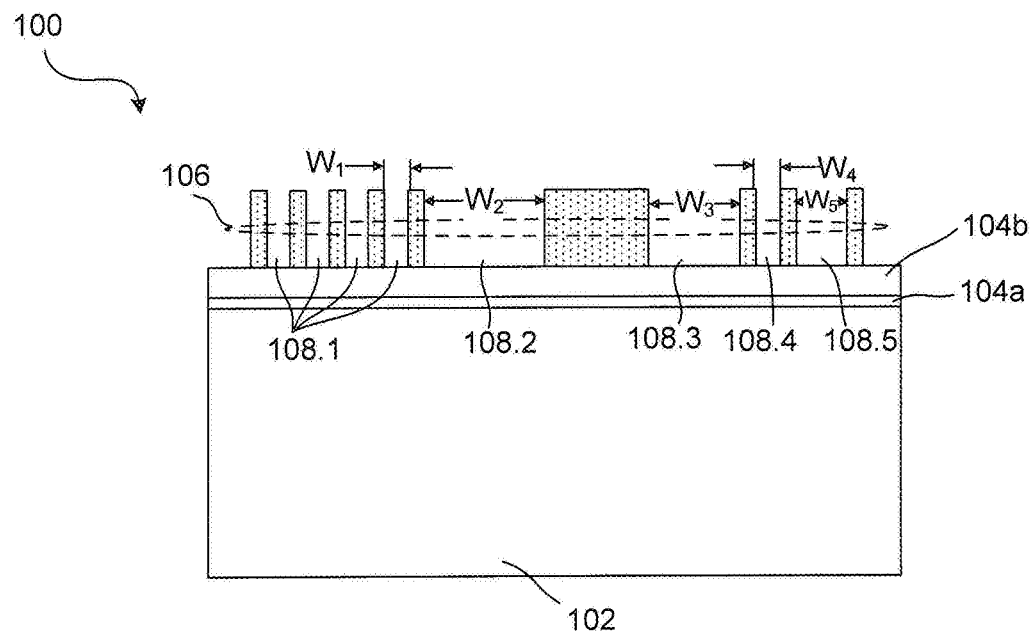
FIGS. 1-5 are views of a semiconductor device at various stages of its fabrication process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

The term "about" as used herein indicates the value of a given quantity varies by ±10% of the value, or optionally ±5% of the value, or in some embodiments, by ±1% of the value so described. For example, "about 100 nm" encompasses a range from 90 nm to 110 nm, inclusive.

The term "nominal" as used herein refers to a value of a characteristic or parameter for a component or a signal, typically set during the design phase of a product, together with a range of values above and/or below the value. The range of values is typically due to slight variations in manufacturing processes or tolerances. By way of example and not limitation, a film may be specified as being nominally 100 nm thick, which would be understood to mean 100 nm plus or minus a certain percentage (e.g., ±1%, ±5%, or ±10%) of the specified value.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein the term "substrate" describes a material onto which subsequent material layers are added. The substrate itself may be patterned, and materials added on top of it may also be patterned, or may remain without patterning. Furthermore, "substrate" may be any of a wide array of semiconductor materials such as silicon, germanium, gallium arsenide, indium phosphide, etc. Alternatively, the substrate may be electrically non-conductive such as a glass or sapphire wafer.

An Example Method for Fabricating a FinFET according to an Embodiment

FIGS. 1-5 and 7-13 are various perspective and cross-sectional views of a semiconductor device 100 at various stages of fabrication, according to some embodiments.

FIG. 1 is a cross-sectional view of a partially fabricated semiconductor device 100 after patterning of a semiconductor substrate 102, according to some embodiments. A pad layer 104a and a mask layer 104b are formed on substrate 102. Pad layer 104a may be a thin film comprising silicon oxide formed, for example, using a thermal oxidation process. Pad layer 104a may act as an adhesion layer between substrate 102 and mask layer 104b. Pad layer 104a may also act as an etch stop layer for etching mask layer 104b. In an embodiment, mask layer 104b is formed of silicon nitride, for example, using low pressure chemical vapor deposition (LPCVD) or plasma enhanced CVD (PECVD). Mask layer 104*b* is used as a hard mask during subsequent etch processes. A patterned photoresist layer 106 is formed on mask layer 104*b* having openings 108.1 through 108.5.

Figure 2:
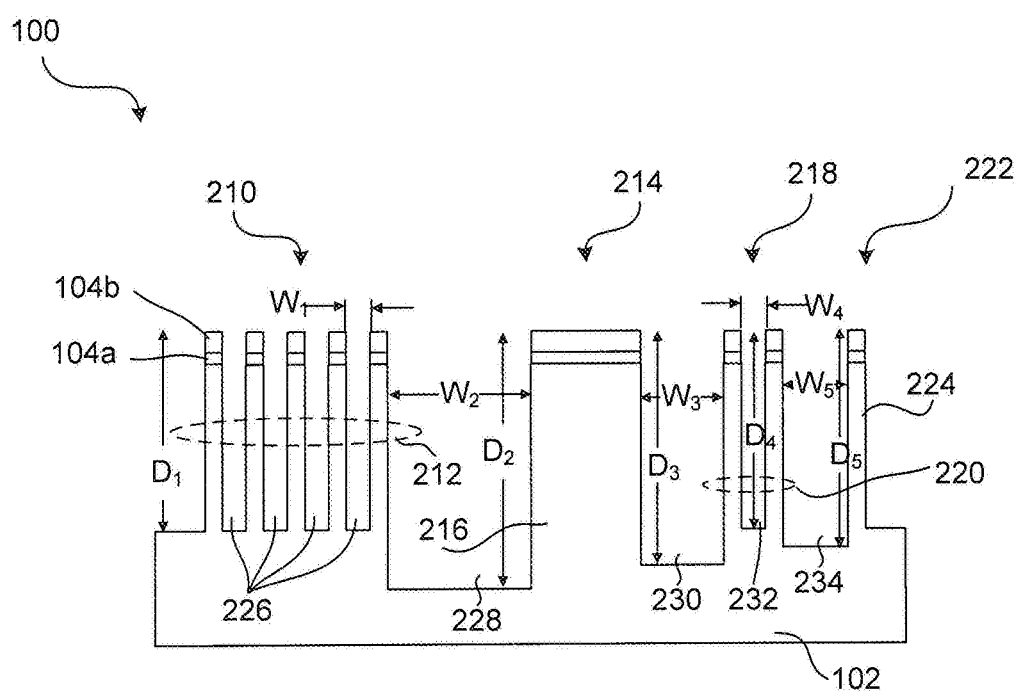

FIG. 2 is a cross-sectional view of a partially fabricated semiconductor device 100 after the formation of fins 212 of fin region 210, fin 216 of fin region 214, fins 220 of fin region 218, and fin 224 of fin region 222, according to an embodiment. Mask layer 104*b* and pad layer 104*a* are etched through openings 108.1 through 108.5 to expose underlying substrate 102, The exposed substrate 102 is then etched to form trenches 226, 228, 230, 232, and 234 in substrate 102. Trenches 226, 228, 230, 232, and 234 may have depths $D_1$, $D_2$, $D_3$, $D_4$, and/or $D_5$, respectively that may depend on the etching parameters and may also depend on widths $W_1$, $W_2$, $W_3$, $W_4$, and $W_5$ of openings 108.1 through 108.5, respectively, due to etch rate loading effects. That is, a wider exposed area of substrate 102 may etch faster than a narrower exposed area of substrate 102 due to etch rate loading effects and consequently, form deeper trenches through wider openings in the patterned photo-sensitive layer 106 than through narrower openings in the patterned photo-sensitive layer 106. For example, area of substrate 102 corresponding to opening 108.2 is wider than areas of substrate 102 corresponding to openings 108.1, 108.3, 108.4, and/or 108.5 and as such, depth $D_2$ of trench 228 formed through opening 108.2 is greater than depths $D_1$, $D_3$, $D_4$, and/or $D_5$ of trenches 226, 230, 232, and/or 234, respectively. In another example, depths $D_2>D_3>D_5>D_1$ for widths $W_2>W_3>W_5>W_1$ due to etch rate loading effects. Etch rate loading effect may be observed as etch rate is sensitive to the amount of etch surface and typically etch rate decreases with an increase in the exposed area to be etched.

In some embodiments, widths $W_1$, $W_2$, $W_3$, $W_4$, and $W_5$ of openings 108.1 through 108.5, respectively, corresponding to widths of trenches 226, 228, 230, 232, and 234, respectively, ranges from about 30 nm to about 300 nm while depths $D_1$, $D_2$, $D_3$, $D_4$, and $D_5$ of trenches 226, 228, 230, 232, and 234 ranges from about 100 nm to about 250 nm. In some embodiments, width W of trenches 226 and/or 232 ranges from about 30 nm to about 150 nm. In some embodiments, the aspect ratio (D/W) of trenches 226, 228, 230, 232, and 234 is greater or lower than about 7.0 or between about 7.0 and about 8.0.

Portions of substrate 102 between trenches 226, 228, 230, 232, and 234 form fins 212, 216, 220, and 224. In some embodiments, trenches 226, 228, 230, 232, and 234 are spaced apart from each other by a spacing (i.e., fin widths) that ranges from about 30 nm to about 150 nm. Photoresist 106 is then removed. Next, a cleaning may be performed to remove a native oxide of the semiconductor substrate 102. The cleaning may be performed using diluted hydrofluoric acid.

Figure 3:
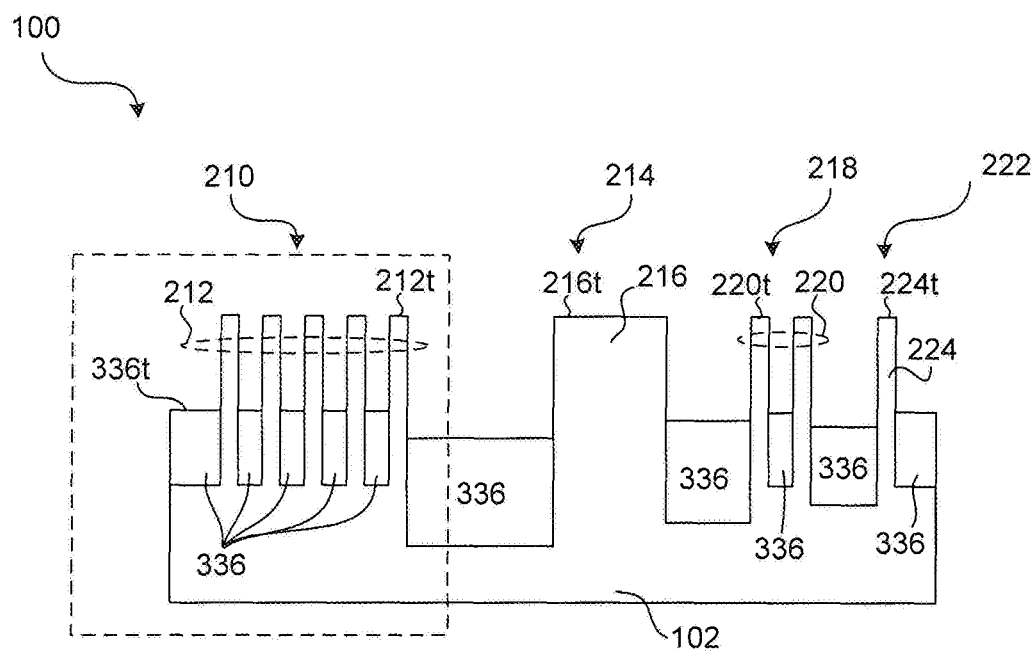
Figure 4:
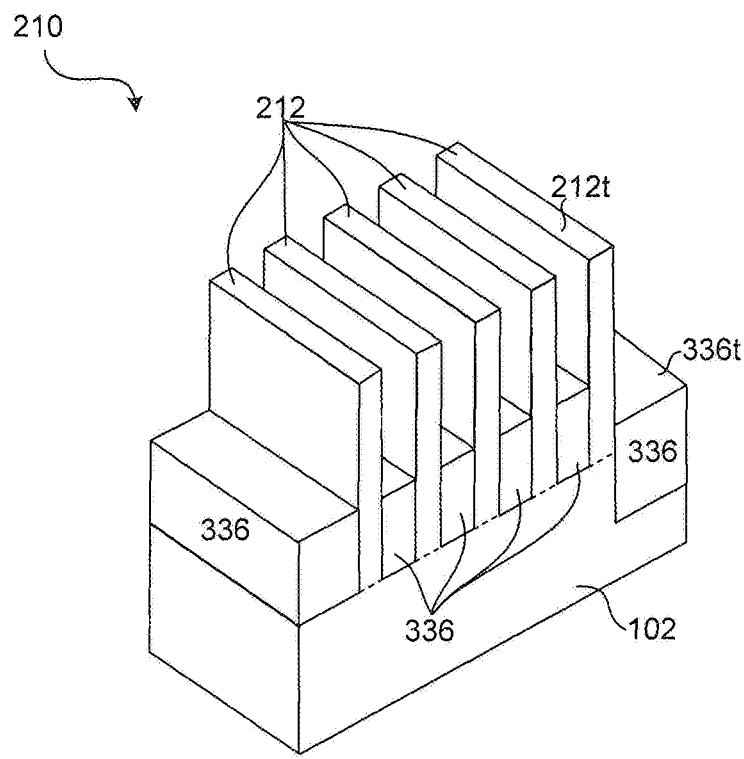

FIG. 3 is a cross-sectional view of a partially fabricated semiconductor device 100 after the formation of STI regions 336, according to an embodiment. FIG. 4 is a perspective view of fin region 210 of semiconductor device 100 of FIG. 3, according to an embodiment. The formation of STI regions 336 involves deposition and etching of a dielectric material. Trenches 226, 228, 230, 232, and 234 are filled with a dielectric material. The dielectric material may include silicon oxide, In some embodiments, other dielectric materials, such as silicon nitride, silicon oxynitride, fluoride-doped silicate glass (FSG), or a low-k dielectric material, may also be used. In an embodiment, the dielectric material may be formed using a flowable CVD (FCVD) process, a high-density-plasma (HDP) CVD process, using silane ($SiH_4$) and oxygen ($O_2$) as reacting precursors. In other embodiments, the dielectric material may be formed using a sub-atmospheric CVD (SACVD) process or high aspect-ratio process (HARP), wherein process gases may comprise tetraethoxysilane (TEOS) and/or ozone ($O_3$). In yet other embodiments, the dielectric material may be formed using a spin-on-dielectric (SOD) such as hydrogen silsesquioxane (HSC) or methyl silsesquioxane (MSQ).

A chemical mechanical polish or a wet etch process is then performed for the removal of mask layer 104*b* and pad layer 104*a*. This removal is followed by an etching of the dielectric material to form STI regions 336 as shown in FIG. 3. In one embodiment, the etching of the dielectric material may be performed using a wet etching process, for example, by dipping substrate 102 in hydrofluoric acid (HF). In another embodiment, the etching operation may be performed using, a dry etching process, for example, the dry etching process may be performed using $CHF_3$ or $BF_3$ as etching gases. The upper portions of fins 212, 216, 220, and/or 224 protruding over the substantially flat top surfaces 336*t* of STI regions 336 are used to form one or more channel regions in one or more finFETs having fin regions 210, 214, 218, and/or 222. In some embodiments, flat top surfaces 336*t* of STI regions 336 are lower than top surfaces 212*t*, 216*t*, 220*t*, and 224*t* of fins 212, 216, 220, and 224, respectively. In an embodiment, a vertical dimension of each of the upper portions of the fins may range from about 15 nm to about 50 nm. In another embodiment, a vertical dimension of each of the upper portions may range from about 20 nm to about 40 nm. Yet in another embodiment, a vertical dimension of each of the upper portions may range from about 25 nm to about 35 nm.

Figure 5:
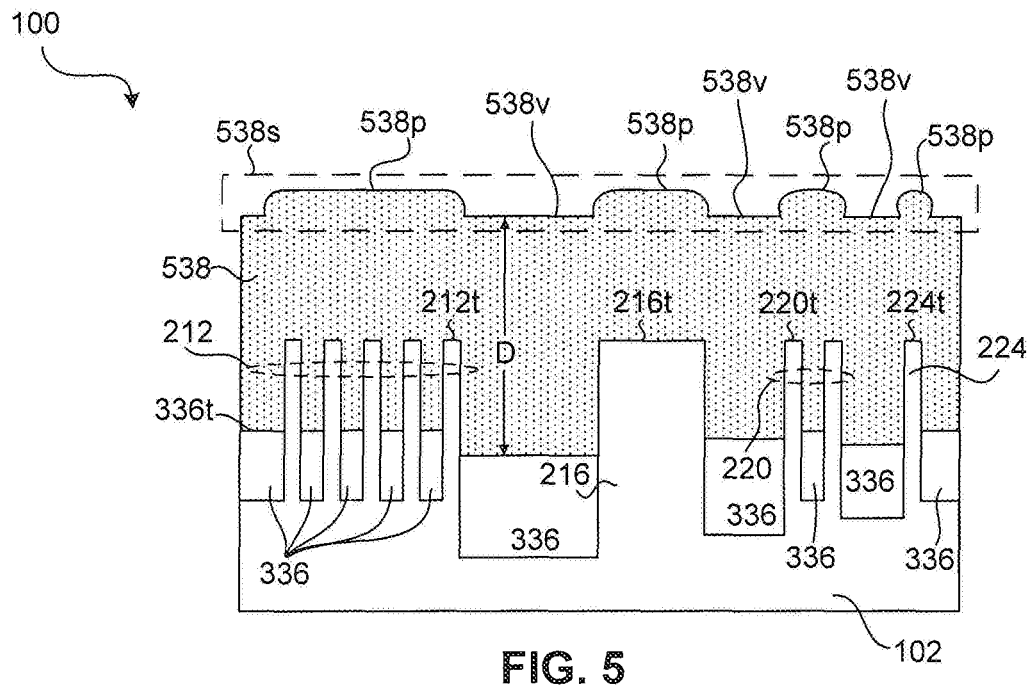

FIG. 5 is a cross-sectional view of a partially fabricated semiconductor device 100 after a blanket deposition of a polysilicon layer 538 on semiconductor device 100, according to an embodiment. Polysilicon layer 538 is formed over top surfaces 336*t* of STI regions 336 and over top surfaces 212*t*, 216*t*, 220*t*, and 224*t* of fins 212, 216, 220, and 224, respectively, to wrap around the upper portions of fins 212, 216, 220, and 224 protruding over top surfaces 336*t* of STI regions 336. Interfaces are formed between the top surfaces 212*t*, 216*t*, 220*t*, and 224*t* and polysilicon layer 538. Polysilicon layer 538 is formed by any suitable deposition process. Examples of the deposition process include CVD, physical vapor deposition (PVD), atomic layer deposition (ALD), other suitable methods, and/or combinations thereof.

As illustrated in FIG. 5, polysilicon layer 538 has a non-planar surface topography 538*s* with a plurality of peaks or raised regions 538*p* and valleys or recesses 538*v*, according to an embodiment. Surface topography 538*s* may be influenced by the underlying semiconductor device topography of fin regions 210, 214, 218, and 222 and/or STI regions 336. Layers deposited by deposition processes such as CVD, PVD, and/or ALD typically follow topography of the underlying surface. In some embodiments, polysilicon layer 538 has a thickness D in a range from about 200 nm to about 250 nm.

For subsequent processing of semiconductor device 100 (e.g., formation of gate structures on fin regions 210, 214, 218, and 222), surface topography 538*s* of polysilicon layer 538 may be planarized. Typically, non-planar surface topography of polysilicon layers in semiconductor devices are planarized using a chemical mechanical polishing (CMP) process. However, CMP performance on the non-planar surface topography of polysilicon layers is affected by the density of underlying device structures as described below with reference to FIG. 6.

Figure 6:
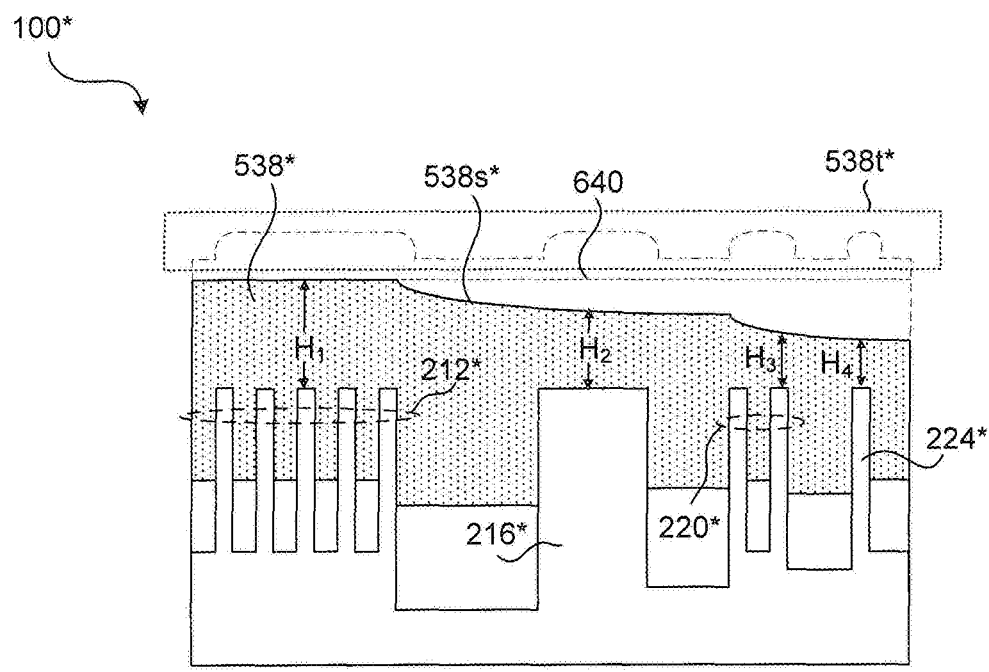
FIG. 6 is a cross-sectional view of a partially fabricated semiconductor device.

FIG. 6 illustrates CMP performance on a polysilicon layer 538* of a semiconductor device 100* is adversely affected by varying density of underlying fins 212*, 216*, 220*, and 224* and non-planar surface topography 538t* of polysilicon layer 538*. Semiconductor device 100*, fins 212*, 216*, 220*, and 224*, and polysilicon layer 538* may be similar in structure and function as semiconductor device 100, fins 212, 216, 220, and 224, and polysilicon layer 538, respectively, according to some embodiments. Fins 212*, 216*, 220*, and 224* may be similarly situated with respect to each other as fins 212, 216, 220, and 224 of semiconductor device 100, according to some embodiments. Portions of polysilicon layer 538* over closely-spaced fins (e.g., fins 212*) are polished at a slower rate than portions of polysilicon layer 538* over less densely situated fins (e.g., 216*, 220*, and/or 224*). That is, less polysilicon is removed from portions of polysilicon layer 538* over closely-spaced fins (e.g., fins 212*) compared to polysilicon removed from portions of polysilicon layer 538* over less closely-spaced fins (e.g., 216*, 220*, and/or 224*). As a result, erosion occurs in the planarized polysilicon layer 538* over the less closely-spaced fins. Thus portions of planarized polysilicon surface 538s* over the less closely-spaced fins (e.g., 216*, 220*, and/or 224*) are below a desired planarized polysilicon surface level 640. Due to such device pattern density dependent non-uniform CMP process, thickness of polysilicon layer 538* over fins 212*, 216*, 220*, and 224* can vary, where thickness $H_1$ of polysilicon layer 538* over fins 212*>thickness $H_2$ of polysilicon layer 538* over fin 216* >thickness $H_3$ of polysilicon layer 538* over fins 220*>thickness $H_4$ of polysilicon layer 538* over fin 224*. In various examples, differences between $H_1$, $H_2$, $H_3$, and/or $H_4$ may range from about 40 nm to about 50 nm. Such variation in polysilicon thickness over fins may result in variation in gate structure heights over fins 212*, 216*, 220*, and 224 and consequently, cause variation in metal gate heights of finFETs of semiconductor device 100*. The variation in metal gate heights of finFETs may cause degradation of semiconductor device 100* performance.

Figure 7:
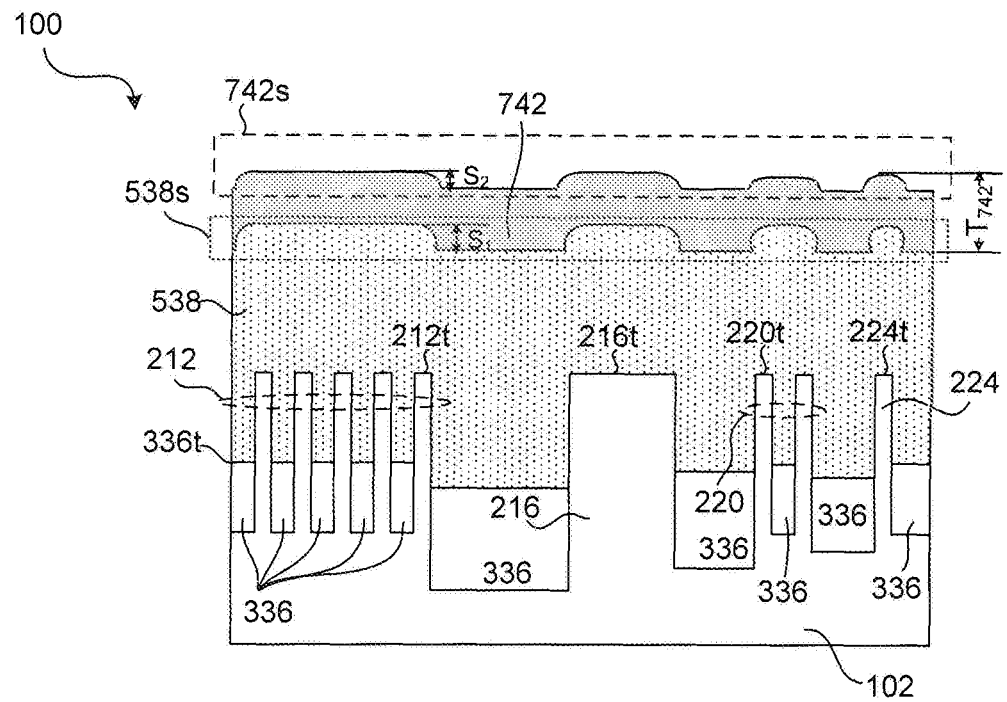
FIGS. 7-13 are views of a semiconductor device at various stages of its fabrication process, in accordance with some embodiments.
Figure 8:
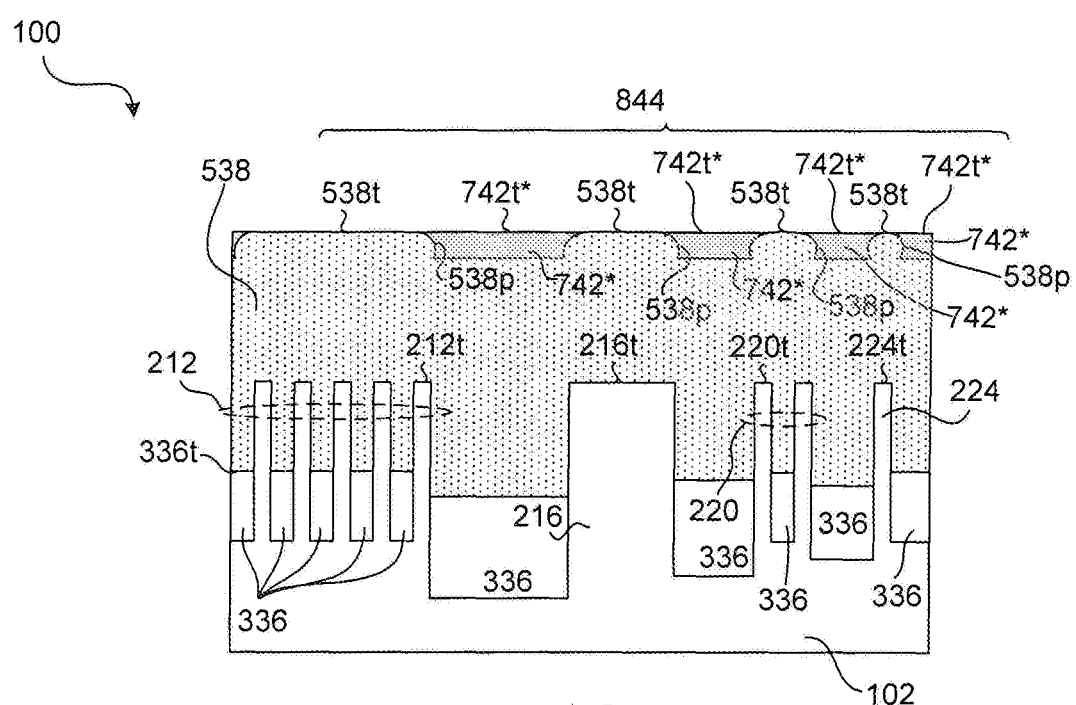
Figure 9:
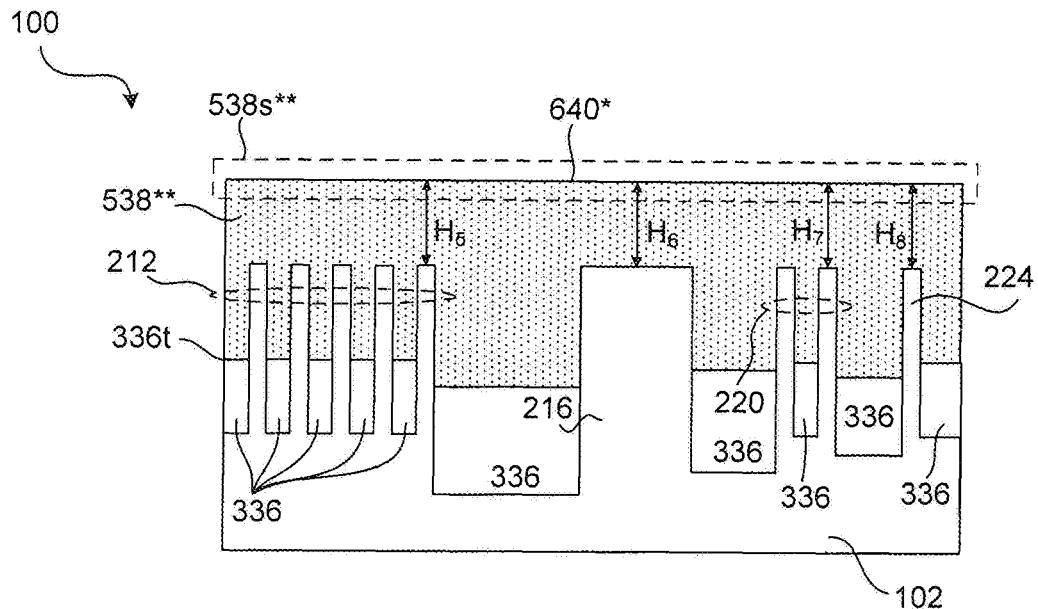

In order to overcome such disadvantages of current CMP processes of polysilicon layers overlying device structures of varying density in semiconductor devices, FIGS. 7-9 illustrate a sacrificial cap layer based planarization process for planarizing the non-planar surface topography 538s of polysilicon layer 538, according to an embodiment. In some embodiments, variation in polysilicon thickness over fins 212, 216, 220, and 224 due to erosion is reduced by a range from about 90% to about 98% using the sacrificial cap layer based planarization process compared to the current CMP processes. The sacrificial cap layer based planarization process may include deposition of a sacrificial cap layer (e.g., sacrificial cap layer 742), selective removal of portions of sacrificial cap layer 742, and non-selective removal of remaining portions of sacrificial cap layer 742 and portions of polysilicon 538 to achieve a substantially planar surface topography 538s**.

FIG. 7 is a cross-sectional view of a partially fabricated semiconductor device 100 after deposition of a sacrificial cap layer 742 on polysilicon layer 538, according to an embodiment. In some embodiments, sacrificial cap layer 742 may include an insulating material, a polymeric material, a semiconducting material, a conducting material, or a combination thereof. In some embodiments, an insulating material may include an oxide, a nitride, or a combination thereof. Sacrificial cap layer 742 may be formed by any suitable deposition process. Examples of the deposition process include CVD, PVD, ALD, LPCVD, FCVD, PECVD, spin coating, other suitable deposition methods, and/or combinations thereof.

In some embodiments, material(s) for sacrificial cap layer 742 may be selected based on their conformal properties to underlying structures, films, and/or substrate. In some embodiments, material(s) for sacrificial cap layer 742 may be selected based on achieving a surface topography 742s of sacrificial cap layer 742 that has a non-planarity less than, non-planarity of surface topography 538s. That is, material(s) for sacrificial cap layer 742 may be selected such that sacrificial cap layer 742 is poorly conformal to polysilicon layer 538 and surface topography 742s of sacrificial cap layer 742 may not substantially similar to surface topography 538s. For example, material(s) for sacrificial cap layer 742 may be selected such that topography height $S_2$ of surface topography 742s of sacrificial cap layer 742 is less than topography height $S_1$ of surface topography 538s.

In some embodiments, sacrificial cap layer 742 may include polyimides or doped glass (e.g., borophosphosilicate glass (BPSG)) that are less conformal on polysilicon layer 538 than oxide or nitride materials. Sacrificial cap layer 742 including polyimides or doped glass may provide a surface topography 742s of sacrificial cap layer 742 with a non-planarity less than that of surface topography 742s achieved with sacrificial cap layer 742 including oxide or nitride materials. Sacrificial cap layer 742 including oxides, nitrides, or a combination thereof may be deposited using a suitable deposition process to achieve a less conformal sacrificial cap layer 742 and as a result, surface topography 742s that has a non-planarity less than surface topography 538s. In some embodiments, sacrificial cap layer 742 thickness $T_{742}$ may be several microns (e.g., in a range of about 1-3 μm) to achieve surface topography 742s that has a non-planarity less than surface topography 538s.

In some embodiments, sacrificial cap layer 742 may include material(s) for which a first etchant or slurry has a higher selectivity for the sacrificial cap layer 742 material(s) than for polysilicon layer 538 and may include material(s) for which a second etchant or slurry has a substantially similar selectivity for both the sacrificial cap layer 742 material(s) and polysilicon layer 538. In some embodiments, the first etchant or slurry may have a sacrificial cap layer 742 material(s) to polysilicon layer 538 selectivity greater than about 20:1, such as about 30:1, about 40:1, or about 50:1.

FIG. 8 is a cross-sectional view of a partially fabricated semiconductor device 100 after formation of a nominally planar composite surface 844, according to an embodiment. Composite surface 844 may include top surfaces 538t of one or more peaks or raised regions 538p of polysilicon layer 538 and top surfaces 742t* of one or more planarized sacrificial cap layer portions 742*, according to an embodiment. The formation of composite surface 844 includes planarizing sacrificial cap layer 742 to form planarized sacrificial cap layer portions 742* within valleys or recesses 538v (shown in FIG. 5) of polysilicon layer 538, according to an embodiment. Planarizing of sacrificial cap layer 742 may include using a CMP process, a wet etch process, or a dry etch process, according to various embodiments. In an embodiment, polysilicon layer 538 may act as a planarization stop layer during planarizing of sacrificial cap layer 742 and sacrificial cap layer 742 may be planarized until top surfaces 538t of one or more peaks or raised regions 538p are exposed. Each of the planarized sacrificial cap layer portions 742* may be separated from each other by peaks or raised regions 538p of polysilicon layer 538. Top surfaces 742t* of planarized sacrificial cap layer portions 742* may be nominally coplanar with top surfaces 538t of peaks or raised regions 538p.

In some embodiments, planarizing of sacrificial cap layer 742 having one or more oxides may include polishing sacrificial cap layer 742 using a CMP slurry having a sacrificial cap layer 742 to polysilicon layer 538 selectivity greater than about 20:1 such as, about 30:1, about 40:1, or about 50:1. The CMP slurry may comprise silica ($SiO_2$) or cerium oxide ($CeO_2$) abrasive particles in an aqueous solution. The aqueous solution may have a pH in a range of about 3 to about 6. In some embodiments, the CMP slurry may include silica with a percentage in a range of about 0.5% to about 12% and/or may include cerium oxide with a percentage in a range of about 0.1% to about 8%. The silica and/or cerium oxide abrasive particle in the CMP slurry may include particle sizes in a range of about 2 nm to about 50 nm, according to some embodiments. In some embodiment, the formation of planarized sacrificial cap layer 742* may further include distributing the CMP slurry on a polishing surface (e.g., CMP platen, polishing pad), rotating the polishing surface at a speed in a range of about 40 rpm to about 90 rpm, and applying a polishing pressure between sacrificial cap layer 742 and the polishing surface in a range of about 1 psi to about 3.5 psi. In some embodiments, the polishing of sacrificial cap layer 742 may be performed at room temperature or at a temperature in a range of about 20° C. to about 60° C. In an embodiment, the CMP slurry may polish or remove sacrificial cap layer 742 having at a rate of about 300 to 3,000 Angstroms per minute. In an embodiment, the polishing of sacrificial cap layer 742 having an oxide may be performed using, a $CeO_2$ based CMP slurry at a temperature of about 25° C. The $CeO_2$ based CMP slurry may polish or remove sacrificial cap layer 742 having an oxide at a rate of about 2,000 Angstroms per minute, according to an embodiment.

In alternative embodiments, planarizing of sacrificial cap layer 742 may include dry etching sacrificial cap layer 742 using a reactive ion etch (RIE), a inductive coupled plasma (ICP) etch process, or an HDP etch process. The etchant used in the dry etching process may have a sacrificial cap layer 742 to polysilicon layer 538 selectivity greater than about 20:1 such as, about 30:1, about 40:1, or about 50:1. The etchant may include a gas mixture having gases such as, but not limited to, $CF_4$, $CHF_3$, $C_2F_6$, $C_4F_8$, and/or $SF_6$. In some embodiments, the dry etching of sacrificial cap layer 742 may be performed at room temperature or at a temperature in a range of about 30° C. to about 80° C. In an embodiment, the dry etching of sacrificial cap layer 742 may be performed at a temperature of about 50° C.

Thus, the formation of nominally planar composite surface 844 may help to provide a planar surface topography that is independent of underlying density of device structures or fins of semiconductor device 100. Such planar surface topography may help in performing a substantially uniform CMP process on polysilicon layer 538 as illustrated below with respect to FIG. 9 and reduce CMP induced erosion during CMP of polysilicon layer 538 as described above with respect to FIG. 6.

FIG. 9 is a cross-sectional view of a partially fabricated semiconductor device 100 after formation of a planarized polysilicon layer 538 having a nominally planar surface topography 538s, according to an embodiment. As shown in FIG. 9, the thicknesses H5, H6, H7, and H8 of planarized polysilicon layer 538 over fins 212, 216, 220, and 224, respectively, are substantially similar, and CMP induced erosion is not observed during the formation of planarized polysilicon layer 538.

The formation of planarized polysilicon layer 538** includes polishing, composite surface 844 until substantially all planarized sacrificial cap layer portions 742* and peaks or raised regions 538p of polysilicon layer 538 are removed, according to an embodiment. The polishing of composite surface 844 may include using a CMP process and a CMP slurry having a sacrificial cap layer 742 to polysilicon layer 538 selectivity of about 1. That is, planarized sacrificial cap layer portions 742* and peaks or raised regions 538p may be removed at a substantially similar rate. The CMP slurry may comprise silica abrasive particles in an aqueous solution. The aqueous solution may include an alkaline solution or other solution and may have a pH in a range of about 10 to about 12. The silica abrasive particle in the CMP slurry may include particle sizes in a range of about 2 nm to about 50 nm, according to some embodiments. In some embodiments, the polishing of composite surface 844 may be performed at room temperature or at a temperature in a range of about 25° C. to about 60° C.

In alternative embodiments, the formation of planarized polysilicon layer 538** includes etching planarized sacrificial cap layer portions 742* and polysilicon layer 538 until substantially all planarized sacrificial cap layer portions 742* and peaks or raised regions 538p are removed, according to an embodiment. The etching may include using a RIE process, an ICP etch process, or an HDP etch process. The etchant used in the dry etching process may have a sacrificial cap layer 742 to polysilicon layer 538 selectivity of about 1. The etchant may include a gas mixture having gases such as, but not limited to, $CF_4$, $CHF_3$, $C_2F_6$, $C_4F_8$, and/or $SF_6$. In some embodiments, the dry etching of sacrificial cap layer 742 may be performed at room temperature or at a temperature in a range of about 30° C. to about 80° C.

Figure 10:
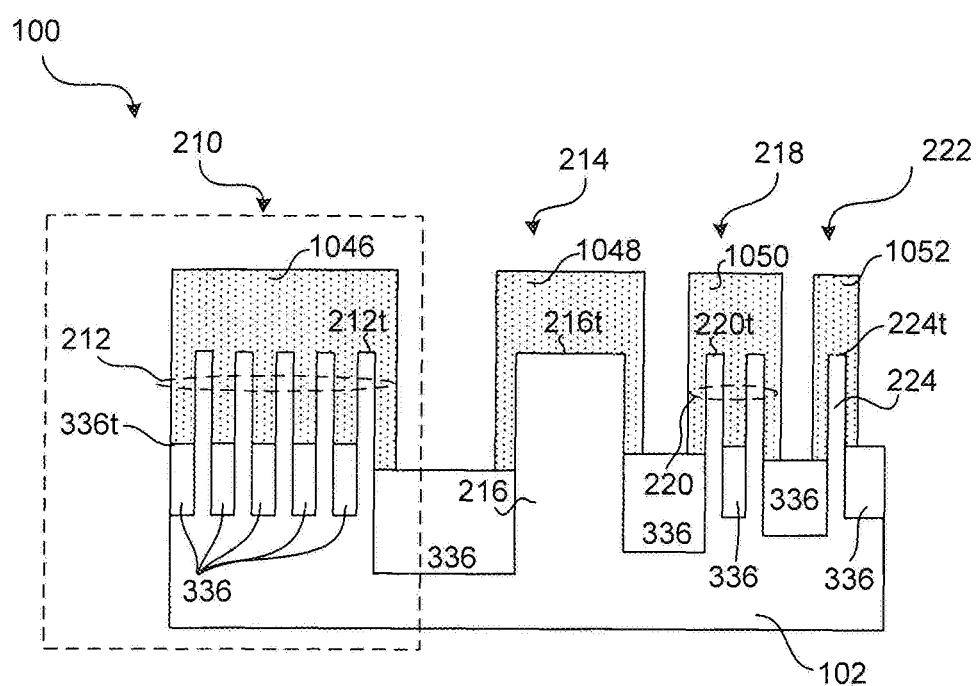

FIG. 10 is a cross-sectional view of a partially fabricated semiconductor device 100 after the formation of a gate structures 1046, 1048, 1050, and 1052 on fins 212, 216, 220, and 224, respectively, and STI regions 336, according to an embodiment. The formation of gate structures 1046, 1048, 1050, and 1052 includes a photolithography patterning process and etching of planarized polysilicon layer 538**, according to an embodiment. The photolithography patterning process includes photoresist coating (e.g., spin-on coating), soft baking, mask aligning, exposure, post-exposure baking, developing the photoresist, rinsing, drying (e.g., hard baking), other suitable processes, and/or combinations thereof. The etching include dry etching (e.g., RIE), wet etching, and/or other etching methods.

Figure 11:
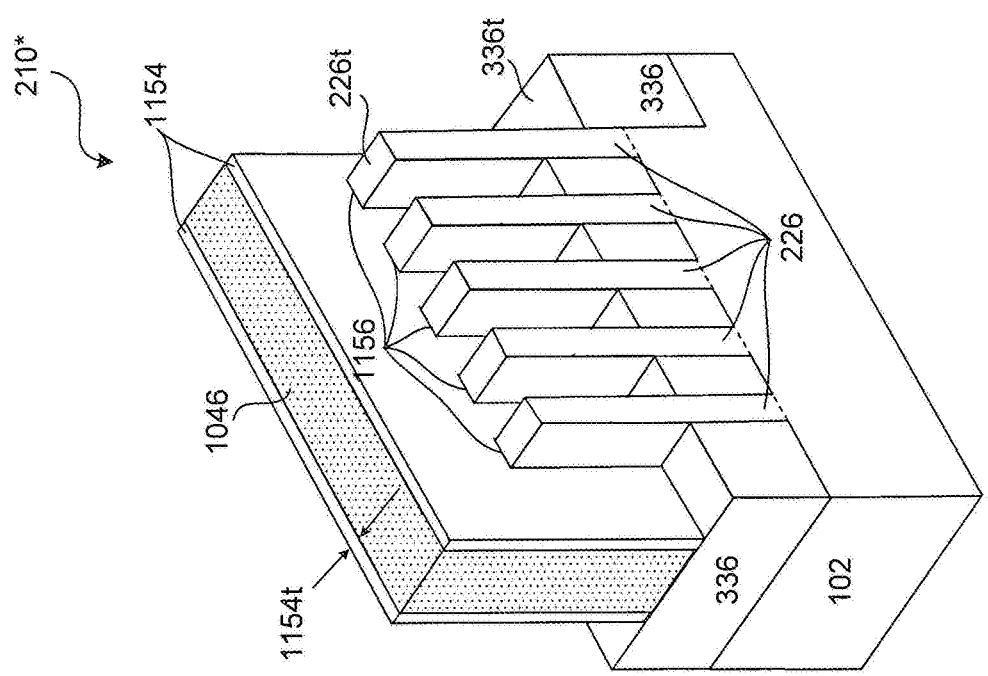

FIG. 11 is a perspective view of a partially fabricated finFET 210* of semiconductor device 100 of FIG. 10 after the formation of spacers 1154, according to an embodiment. Spacers 1154 are formed over top surfaces 336t of STI regions 336 and over top surfaces 226t of fins 226 to wrap around the upper portions of fins 226 protruding over top surfaces 336t of STI regions 336. Interfaces 1156 are formed between the upper portions of fins 226 and gate structure 1046 and spacers 1154. Spacers 1154 may include dielectric material such as silicon oxide, silicon carbide, silicon nitride, silicon oxynitride, or other suitable material. Spacers 1154 may comprise a single layer or multilayer structure. A blanket layer of a dielectric material may be formed by CVD, PE CVD, ALD, or other suitable technique followed by an anisotropic etching of the dielectric material to form spacers 1154 on two sides of gate structure 1046. Each of spacers 1154 has a thickness 1154*t* in a range from about 5 nm to about 15 nm.

Figure 12:
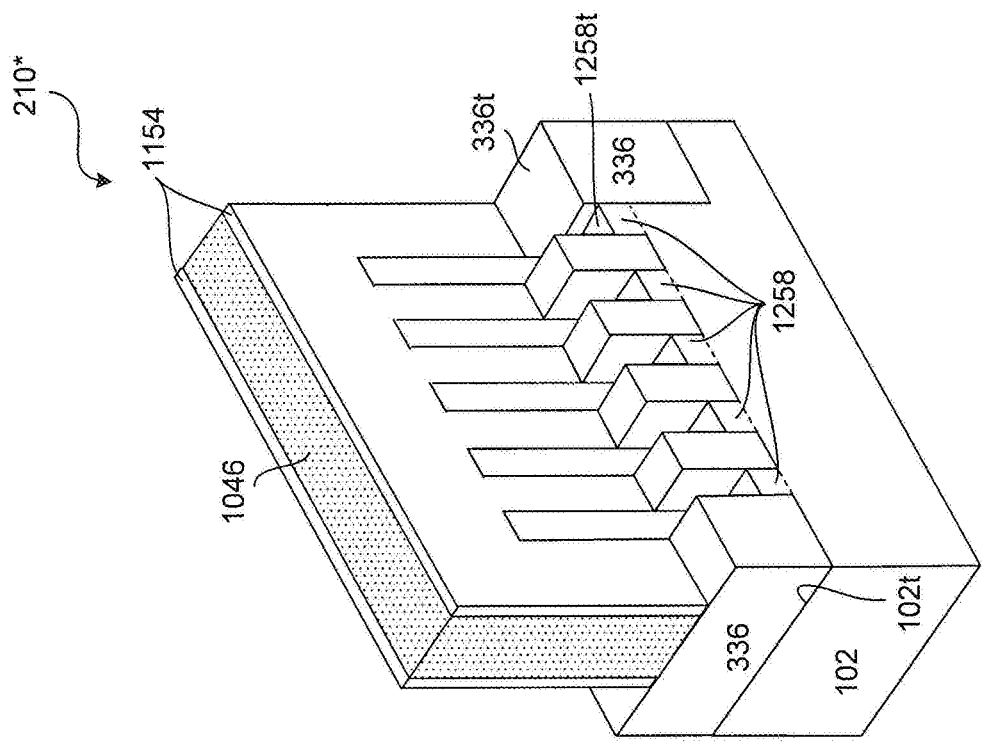

FIG. 12 is a perspective view of a partially fabricated finFET 210* after the formation of portions 1258 of fins 226, according to an embodiment. The portions of fins 226 that are not covered by gate structure 1046 are recessed to form portions 1258 having top surfaces 1258*t*. In an embodiment, top surfaces 1258*t* of portions 1258 are below the top surfaces 336*t* of STI regions 336. In alternative embodiments, the portions of fins 226 that are not covered by gate structure 1046 are recessed to expose top surface 102*t* of substrate 102. In one embodiment, using spacers 1154 as masks, a biased etching process is performed to form portions 1258. In an embodiment, the etching process may be performed under a pressure of about 1 mTorr to about 1,000 mTorr, a power of about 50 W to about 1,000 W, a bias voltage of about 20 V to about 500 V, at a temperature of about 40° C. to about 60° C., and using a HBr and/or $Cl_2$ as etch gases. Also, in the embodiments provided, the bias voltage used in the etching process may be tuned to allow better control of an etching direction to achieve desired profiles for portions 1258.

Figure 13:
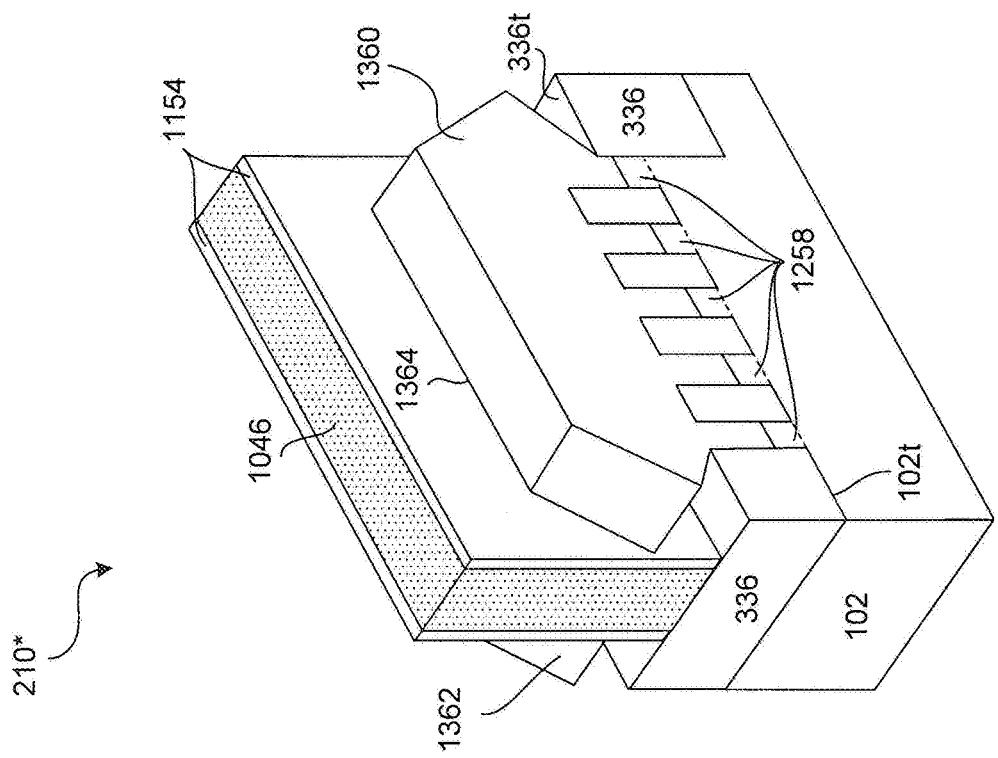

FIG. 13 is a perspective view of a partially fabricated finFET 210* after the formation of source and drain regions 1360 and 1362 on portions 1258 of fins 226, according to an embodiment. Source and drain regions 1360 and 1362 include epitaxially grown strained semiconductor material on portions 1258. Strained semiconductor material of source and drain regions 1360 and 1362 are grown over portions 1258 by selective epitaxy. In some embodiments, the selective epitaxial growth produces a strained semiconductor material of source and drain regions 1360 and 1362 and continues until the strained semiconductor material extends vertically a distance in a range from about 10 nm to about 100 nm above top surface 102*t* of substrate 102 and extends laterally over top surfaces 336*t* of some of STI regions 336. The strained semiconductor material includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes for growing the strained semiconductor material may include CVD deposition techniques (e.g., LPCVD, vapor-phase epitaxy (VPE) and/or ultra-high vacuum CVD (UHV-CVD)), molecular beam epitaxy, and/or other suitable processes. In an embodiment, the strained semiconductor material, such as silicon carbon (SiC), is epi-grown by a LPCVD process to form the source and drain regions 1360 and 1362 of an n-type finFET 210*. The LPCVD process is performed at a temperature of about 400° C. to about 800° C. and under a pressure of about 1 Torr to about 200 Torr, using $Si_3H_8$ and $SiH_3CH$ as reaction gases. In another embodiment, the strained semiconductor material, such as silicon germanium (SiGe), is epi-grown by a LPCVD process to form the source and drain regions 1360 and 1362 of a p-type finFET 210*. The LPCVD process is performed at a temperature of about 400° C. to about 800° C. and under a pressure of about 1 Torr to about 200 Torr, using $SiH_4$ and $GeH_4$ as reaction gases.

Source and drain regions 1360 and 1362 may be in-situ doped during the epitaxial growth of the strained semiconductor material. According to various embodiments, the epitaxially grown source and drain regions 1360 and 1362 may be doped with p-type dopants, such as boron or $BF_2$; n-type dopants, such as phosphorus or arsenic; and/or combinations thereof; epitaxially grown strained SiGe source and drain regions 1360 and 1362 may be doped with p-type dopants, such as boron or $BF_2$, n-type dopants, such as phosphorus or arsenic, and/or combinations thereof; epitaxially grown Si source and drain regions 1360 and 1362 may be doped with carbon to form Si:C source/drain features, phosphorous to form Si:P source/drain features, or both carbon and phosphorous to form SiCP source/drain features. In one embodiment, source and drain regions 1360 and 1362 are not in-situ doped, an ion implantation process is performed to dope source and drain regions 1360 and 1362. One or more annealing processes may be performed to activate source and drain regions 1360 and 1362. The annealing processes may comprise, but are not limited to rapid thermal annealing (RTA) and/or laser annealing processes.

Further illustrated in FIG. 13 are interfaces 1364 between spacers 1154 and source and drain regions 1360 and 1362. In an embodiment, interfaces 1364 are coplanar with interfaces 1156 shown in FIG. 11. In other embodiments, interfaces 1364 are either above or below interfaces 1156.

Formation of source and drain regions may be followed by formation of other elements of semiconductor device 100 such as ILD, source and drain contacts, gate contacts, metal gate structure, vias, interconnect metal layers, dielectric layers, passivation layers, etc. that are not shown for the sake of simplicity. For example, formation of source and drain regions may be followed by replacement polysilicon of gate structures 1046, 1048, 1050, and 1052 with gate electrode(s) and gate dielectric(s) using a replacement metal gate (RMG) process.

It should be noted that a person of ordinary skill in the art would understand based on the description herein that semiconductor device 100 may include other devices and functional units that are not shown in FIGS. 1-13 for the sake of simplicity.

For the sake of simplicity, perspective views of finFET 210* of semiconductor device 100 are illustrated in the present disclosure. However, a person of ordinary skill in the art would understand finFETs formed having fin regions 214, 218. and/or 222 may have similar perspective views without departing from the spirit and scope of the present disclosure.

Example Operations for Fabricating a FinFET According to a First Embodiment

Figure 14:
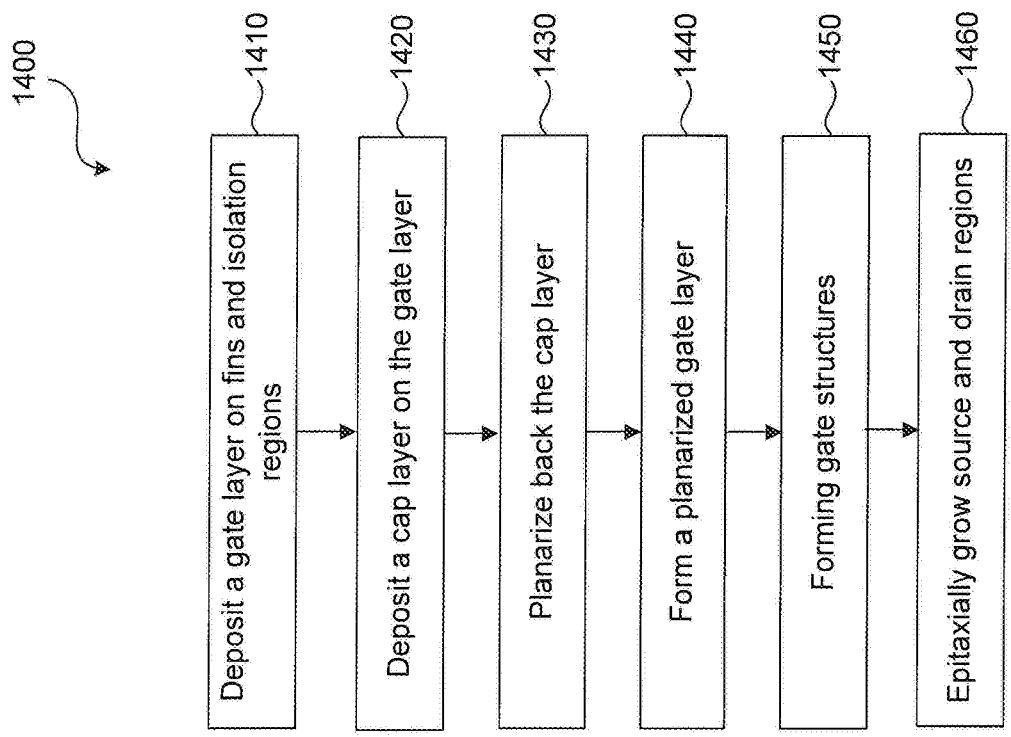
FIG. 14 is a flow diagram of a method for fabricating a semiconductor device, in accordance with some embodiments.

FIG. 14 is a flow diagram of an exemplary method 1400 for fabricating semiconductor device 100. Solely for illustrative purposes, the operations illustrated in FIG. 14 will be described with reference to the example fabrication process illustrated in FIGS. 1-5 and 7-13. Operations can be performed in a different order or not performed depending on specific applications. It should be noted that method 1400 does not produce a completed semiconductor device 100. Accordingly, it is understood that additional processes may be provided before, during, and after method 1400, and that some other processes may only be briefly described herein.

In operation 1410, a gate layer is deposited on fins and isolation regions. For example, a polysilicon layer such as polysilicon layer 538 may be formed on fins 212, 216, 220, and 224 and STI regions 336. Polysilicon layer 538 may be deposited using any suitable deposition process. Examples of the deposition process include CVD, PVD, ALD, other suitable methods, and/or combinations thereof.

In operation 1420, a sacrificial cap layer is deposited on the gate layer of operation 1410. For example, a sacrificial cap layer such as sacrificial cap layer 742 may be formed over polysilicon layer 538. Sacrificial cap layer 742 may be formed by any suitable deposition process or processes. Examples of the deposition process include CVD, PVD, ALD, low pressure chemical vapor deposition (LPCVD), FCVD, PECVD, spin coating, other suitable deposition methods, and/or combinations thereof.

In operation 1430, the sacrificial cap layer of operation 1420 is planarized back. For example, the sacrificial cap layer of operation 1420 may be planarized back to form planarized sacrificial cap layer portions 742\* within valleys or recesses 538v of polysilicon layer 538. Planarizing of sacrificial cap layer 742 may include using a CMP process, a wet etch process, or a dry etch process. The planarizing of sacrificial cap layer 742 may include polishing or etching sacrificial cap layer 742 using a CMP slurry or an etchant, respectively, having a selectivity to sacrificial cap layer 742 in a range from about 20 to about 50 times greater than the selectivity to polysilicon layer 538.

In operation 1440, the gate layer of operation 1410 is planarized. For example, substantially all planarized sacrificial cap layer portions 742\* and peaks or raised regions 538p of polysilicon layer 538 are removed by polishing or etching. The polishing or etching may include using a CMP slurry or an etchant, respectively, having a sacrificial cap layer 742 to polysilicon layer 538 selectivity of about 1.

In operation 1450, gate structures are formed. For example, the planarized polysilicon layer of operation 1440 may patterned and etched to form gate structures such as gate structures 1046, 1048, 1050, and 1052 on fins 212, 216, 220, and 224, respectively, and on STI regions 336. The patterning process may include photoresist coating (e.g., spin-on coating), soft baking, mask aligning, exposure, post-exposure baking, developing the photoresist, rinsing, drying (e.g., hard baking), other suitable processes, and/or combinations thereof. The etching may include dry etching (e.g., RIE), wet etching, and/or other etching methods.

In operation 1460, source and drain regions are formed. For example, source and drain regions such as source and drain regions 1360 and 1362 are formed on portions 1258 of fins 226. Source and drain regions 1360 and 1362 may include epitaxially grown strained semiconductor material. The epitaxial processes for growing the strained semiconductor material may include CVD deposition techniques (e.g., LPCVD, VPE and/or UHV-CVD), molecular beam epitaxy, and/or other suitable processes.

Thus, the present disclosure provides mechanisms for improving planarization of polysilicon gate structures and reducing the dependency of polysilicon planarization on underlying device structure density in semiconductor devices. The mechanisms include deposition of a sacrificial oxide cap layer on a polysilicon layer of gate structures, followed by a high oxide to polysilicon selectivity planarization or etching process, and a subsequent non-selective planarization or etching process. Improvement of the planarization of polysilicon gate structures helps to reduce the variation in heights of gate structures and consequently, improve gate performance of semiconductor devices.

Example Embodiments and Benefits

In an embodiment, a method includes forming fins on a substrate, depositing a gate layer having a first material on the fins, and depositing a sacrificial layer having a second material on the gate layer, the second material being different from the first material. The method further includes removing a first portion of the sacrificial layer using a first slurry or etchant having a first selectivity of second material to first material. The method further includes removing a first portion of the gate layer and a second portion of the sacrificial layer using a second slurry or etchant having a second selectivity of second material to first material to form a planarized gate layer. The first selectivity is greater than the second selectivity. An exemplary benefit of this embodiment is the reduction of the dependency of polysilicon planarization on underlying device structure density. Another exemplary benefit is the reduction in polysilicon thickness on device structures across a wafer by about 90-98% compared to other planarization process that does not use the sacrificial cap layer as described herein.

In a further embodiment, a method of forming a semiconductor device includes forming a patterned layer on a substrate, depositing a polysilicon layer on the patterned layer, and depositing a sacrificial layer on the polysilicon layer, the sacrificial layer having a material different from polysilicon. The method further includes polishing a first portion of the sacrificial layer using a slurry having a first selectivity of material to polysilicon and etching back a first portion of the polysilicon layer and a second portion of the sacrificial layer using an etchant having a second selectivity of material to polysilicon to form in a planarized polysilicon layer. An exemplary benefit of this embodiment is the reduction of the dependency of polysilicon planarization on underlying device structure density. Another exemplary benefit is the reduction in polysilicon thickness on device structures across a wafer by about 90-98% compared to other planarization process that does not use the sacrificial cap layer as described herein.

In a still further embodiment, a method of planarizing a polysilicon layer includes forming fins on a substrate, forming isolation regions on the substrate, depositing the polysilicon layer on the fins and the isolation layers, and depositing an oxide layer on the polysilicon layer. The method further includes polishing a first portion of the oxide layer using a slurry having a first selectivity of oxide to polysilicon and etching back a first portion of the polysilicon layer and a second portion of the oxide layer using an etchant having a second selectivity of oxide to polysilicon to planarize the polysilicon layer. An exemplary benefit of this embodiment is the reduction of the dependency of polysilicon planarization on underlying device structure density. Another exemplary benefit is the reduction in polysilicon thickness on device structures across a wafer by about 90-98% compared to other planarization process that does not use the sacrificial cap layer as described herein.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming fins on a substrate;
   depositing a gate layer having a first material on the fins;
   depositing a sacrificial layer having a second material on the gate layer, the second material being different from the first material;
   etching a first portion of the sacrificial layer using an etchant having a first selectivity of second material to first material greater than about 1:20 and at a temperature from about 30° C. to about 80° C.; and chemical mechanical polishing a first portion of the gate layer and a second portion of the sacrificial layer using a slurry having a second selectivity of second material to first material to form a planarized gate layer, the first selectivity being greater than the second selectivity, wherein the chemical mechanical polishing the first portion of the gate layer and the second portion of the sacrificial layer is performed at a substantially equal rate and at a temperature from about 25° C. to about 60° C.

2. The method of claim 1, wherein the etching the first portion of the sacrificial layer comprises dry etching of the sacrificial layer at a temperature of about 50° C.

3. The method of claim 1, wherein the etching the first portion of the sacrificial layer comprises dry etching of the sacrificial layer.

4. The method of claim 1, wherein the etching the first portion of the sacrificial layer comprises etching back the sacrificial layer to a top surface of the first portion of the gate layer.

5. The method of claim 1, wherein the etching the first portion of the sacrificial layer comprises etching back the sacrificial layer until a top surface of the first portion of the gate layer and a top surface of the second portion of the sacrificial layer are substantially coplanar.

6. The method of claim 1, wherein the second portion of the sacrificial layer is located within a recessed region of the gate layer.

7. The method of claim 1, wherein the gate layer comprises a non-planar surface topography prior to the chemical mechanical polishing of the first portion of the gate layer and the second portion of the sacrificial layer.

8. The method of claim 1, wherein the first material comprises polysilicon.

9. The method of claim 1, wherein the second material comprises an oxide, a nitride, a polymeric material, an insulating material, or a combination thereof.

10. The method of claim 1, wherein the slurry comprises silica or cerium oxide particles.

11. The method of claim 1, wherein the first selectivity of second material to first material is about 1:50; and
wherein the second selectivity of second material to first material is about 1:1.

12. The method of claim 1, wherein a topography height of a surface topography of the sacrificial layer is smaller than a topography height of a surface topography of the gate layer.

13. The method of claim 1, wherein the second material comprises polymides or doped glass.

14. A method of forming a semiconductor device, comprising:

forming a patterned layer on a substrate;

depositing a polysilicon layer on the patterned layer;

depositing a sacrificial layer on the polysilicon layer, the sacrificial layer having a material different from polysilicon;

chemical mechanical polishing a first portion of the sacrificial layer using a slurry having a first selectivity of material to polysilicon greater than about 1:20, wherein the chemical mechanical polishing is performed at a temperature from about 20° C. to about 60° C. and at a rate of about 300 Angstroms per minute to about 3000 Angstroms per minute; and etching a first portion of the polysilicon layer and a second portion of the sacrificial layer using an etchant having a second selectivity of material to polysilicon to form a planarized polysilicon layer, the first selectivity being greater than the second selectivity, wherein the etching the first portion of the polysilicon layer and the second portion of the sacrificial layer is performed at a substantially equal rate.

15. The method of claim 14, wherein the first selectivity is greater than the second selectivity.

16. The method of claim 14, wherein the material comprises an oxide, a nitride, a polymeric material, an insulating material, or a combination thereof.

17. The method of claim 16, wherein the first selectivity of material to polysilicon is about 1:50.

18. A method of planarizing a polysilicon layer, comprising:

forming fins on a substrate;

forming isolation regions on the substrate;

depositing the polysilicon layer over the fins and the isolation regions;

depositing an oxide layer on the polysilicon layer;

chemical mechanical polishing a first portion of the oxide layer using a slurry having a first selectivity of oxide to polysilicon greater than about 1:20, wherein the chemical mechanical polishing is performed at a temperature of about 25° C. and at a rate of about 2000 Angstroms per minute; and etching a first portion of the polysilicon layer and a second portion of the oxide layer using an etchant having a second selectivity of oxide to polysilicon to planarize the polysilicon layer, wherein the etching the first portion of the polysilicon layer and the second portion of the oxide layer is performed at a substantially equal rate.

19. The method of claim 18, wherein the slurry comprises cerium oxide particles.

20. The method of claim 18, wherein the chemical mechanical polishing of the first portion of the oxide layer comprises applying a polishing pressure between the oxide layer and a polishing surface in a range of about 1 psi to about 3.5 psi.

* * * * *